(12) United States Patent
Wachi

(10) Patent No.: US 7,566,905 B2
(45) Date of Patent: Jul. 28, 2009

(54) ELECTRO-OPTICAL APPARATUS, METHOD FOR MANUFACTURING ELECTRO-OPTICAL APPARATUS, AND ELECTRONIC DEVICE

(75) Inventor: Reiko Wachi, Matsumoto (JP)

(73) Assignee: Epson Imaging Devices Corporation (JP)

( * ) Notice: Subject to any disclaimer, the term of this patent is extended or adjusted under 35 U.S.C. 154(b) by 159 days.

(21) Appl. No.: 11/621,242

(22) Filed: Jan. 9, 2007

(65) Prior Publication Data

US 2007/0164283 A1 Jul. 19, 2007

(30) Foreign Application Priority Data

Jan. 18, 2006 (JP) .............. 2006-009536

(51) Int. Cl.
H01L 29/04 (2006.01)
H01L 31/20 (2006.01)
H01L 31/036 (2006.01)
H01L 31/0376 (2006.01)

(52) U.S. Cl. .................. 257/59; 257/49; 257/53; 349/113; 349/138

(58) Field of Classification Search .......... 257/49, 257/53, 59; 349/113, 138
See application file for complete search history.

(56) References Cited

U.S. PATENT DOCUMENTS 6,623,812 B1 * 9/2003 Tanaka et al. .............. 428/1.54
7,193,679 B2 * 3/2007 Sakamoto et al. ........... 349/187
2005/0185121 A1 * 8/2005 Takizawa .................... 349/114
2005/0270449 A1 * 12/2005 Koma et al. ................. 349/114
2008/0151262 A1 * 6/2008 Tanaka et al. ............... 356/601

FOREIGN PATENT DOCUMENTS

| JP | 11-062818 | 3/1999 |
| JP | 11-084375 | 3/1999 |
| JP | 2000-002875 | 1/2000 |
| JP | 2000-284278 | 10/2000 |
| JP | 2001-172339 | 6/2001 |
| JP | 2001-316408 | 11/2001 |
| JP | 2003-075987 | 3/2003 |
| JP | 2003-195347 | 7/2003 |
| JP | 2003-302740 | 10/2003 |
| JP | 2003-315514 | 11/2003 |
| JP | 2004-334243 | 11/2004 |
| JP | 2005-099640 | 4/2005 |
| JP | 2005-164748 | 6/2005 |

* cited by examiner

Primary Examiner—Phuc T Dang
(74) Attorney, Agent, or Firm—Harness, Dickey & Pierce, P.L.C.

(57) ABSTRACT

An electro-optical apparatus includes a base, a resin film on the base, the resin film having at least one of projections and depressions at an upper surface thereof, and a light reflecting film disposed on the at least one of projections and depressions. The resin film under the light reflecting film includes a first region and a second region. A mode of the at least one of projections and depressions in the first region is different from a mode of the at least one of projections and depressions in the second region. A diffuse reflectivity of the first region is larger than a diffuse reflectivity of the second region.

12 Claims, 12 Drawing Sheets

ELECTRO-OPTICAL APPARATUS, METHOD FOR MANUFACTURING ELECTRO-OPTICAL APPARATUS, AND ELECTRONIC DEVICE

The entire disclosure of Japanese Patent Application No. 2006-009536, filed Jan. 18, 2006 is expressly incorporated by reference herein.

BACKGROUND

1. Technical Field

The present invention relates to an electro-optical apparatus, a method for manufacturing an electro-optical apparatus, and an electronic device. In particular, the invention relates to an electro-optical apparatus including a resin film that is excellent in a light scattering property and light directivity, a method for manufacturing the same, and an electronic device including the same.

2. Related Art

A liquid crystal display apparatus, which is one aspect of an electro-optical apparatus, is constructed so as to include a pair of opposing substrates having respective electrodes and a liquid crystal material disposed between the pair of substrates. The liquid crystal display apparatus displays an image by applying a voltage to the opposing electrodes, aligning the liquid crystal material, and deflecting passing light.

One example of the liquid crystal display apparatus is a transreflective liquid crystal apparatus, which includes a transmitting region for transmitting light from a back light to display an image and a reflecting region for reflecting light from the outside to display an image. The transreflective display apparatus has projections and/or depressions formed from a resin material or other materials within, in particular, the reflecting region to adjust a viewing angle. With the shape of the projections and/or depressions, the direction of scattering of light to be reflected can be controlled, and the viewing angle can be adjusted.

However, depending on the arrangement of the projections and/or depressions, they may be aligned in the thickness direction or the plane direction in a predetermined periodic manner. In this case, in response to the periodicity, scattered light beams interfere with each other, interference fringes occur, and thus display quality is degraded.

One electro-optical apparatus to aim to solve such a problem is disclosed in JP-A-2003-075987. According to the electro-optical apparatus, the occurrence of interference fringes is reduced without degrading its light scattering property by the provision of a light reflecting film in which the heights of projections and depressions are substantially the same and these projections and depressions are irregularly arranged with respect to the direction of the plane.

However, for the electro-optical apparatus disclosed in the aforementioned patent document, because the projections and/or depressions are irregularly arranged in the display area in a uniform manner, although the light scattering property, which is an index of visibility from an oblique direction, is improved, the light directivity, which is an index of visibility from a front direction, is not sufficient in some cases. With these irregularly arranged projections and/or depressions, the balance between the light scattering property and the light directivity depends largely on processing precision of the projections and/or depressions mainly. Therefore, in the case of fine design, it is difficult to maintain the balance within a predetermined range in some cases.

SUMMARY

The inventor has made intensive studies, has found that the above-described problems can be solved by provision of a plurality of regions having projections and/or depressions of different modes to an upper portion of a resin film, and has completed the invention.

That is, an advantage of some aspects of the invention is to provide an electro-optical apparatus that can control the balance between visibility from an oblique direction and visibility from a front direction readily with high precision by independent presence of a first region and a second region to an upper portion of a resin film, the mode of the projections and/or depressions in the first region being different from the mode of the projections and/or depressions in the second region, and that is excellent in the light scattering property and light directivity and to provide a method for manufacturing the electro-optical apparatus and an electronic device including the same.

According to a first aspect of the invention, an electro-optical apparatus includes a base, a resin film on the base, the resin film having at least one of projections and depressions at an upper surface thereof, and a light reflecting film disposed on the at least one of projections and depressions. The resin film under the light reflecting film includes a first region and a second region. A mode of the at least one of projections and depressions in the first region is different from a mode of the at least one of projections and depressions in the second region. A diffuse reflectivity of the first region is larger than a diffuse reflectivity of the second region.

That is, the provision of the plurality of regions having the projections and/or depressions of the different modes to the upper portion of the resin film can improve both the diffuse reflectivity, which is an index of visibility from an oblique direction, i.e., the light scattering property, and the light directivity, which is an index of visibility from a front direction, in a balanced manner. The balance between the light scattering property and the light directivity can be changed by a simple method, for example, changing the areas of the first region and the second region, in addition to changing the projections and/or depressions.

Therefore, the provision of the projections and/or depressions for improving the light scattering property in the first region and the projections and/or depressions for improving the light directivity in the second region can independently control the light scattering property and the light directivity and can readily achieve a desired display quality.

In the electro-optical apparatus, it is preferable that a density, $\rho 1$, of the at least one of projections and depressions in the first region may be larger than a density, $\rho 2$, of the at least one of projections and depressions in the second region.

According to this structure, the first region can improve the light scattering property, and the second region can improve the light directivity. Controlling the density of the projections and/or depressions can improve both the light scattering property and the light directivity.

In the electro-optical apparatus, it is preferable that the density $\rho 1$ may be in a range of 30% to 60% and the density $\rho 2$ is less than 30%.

According to this structure, the balance between the light scattering property and the light directivity can be controlled in a predetermined range by adjustment of the value of the density of the projections and/or depressions, and definition in each viewing direction can be controlled in a desired range.

In the electro-optical apparatus, it is preferable that $\phi 1$ may be larger than $\phi 2$, where $\phi 1$ represents an equivalent-circle diameter of each of the at least one of projections and depressions in the first region viewed from a direction of the plane of the base and $\phi 2$ represents an equivalent-circle diameter of each of the at least one of projections and depressions in the second region viewed from the direction of the plane of the base.

According to this structure, the first region can improve the light scattering property, and the second region can improve the light directivity. Controlling the diameter of each of the projections and/or depressions can improve both the light scattering property and the light directivity.

In the electro-optical apparatus, it is preferable that the equivalent-circle diameter $\phi 1$ may be in a range of 4 μm to 12 μm and the equivalent-circle diameter $\phi 2$ may be less than 4 μm.

According to this structure, the balance between the light scattering property and the light directivity can be adjusted in a predetermined range by adjustment of the diameter of each of the projections and/or depressions, and the definition in each viewing direction can be controlled in a desired range.

In the electro-optical apparatus, it is preferable that a height, h1, of each of the at least one of projections and depressions in the first region may be larger than a height, h2, of each of the at least one of projections and depressions in the second region.

According to this structure, when the equivalent-circle diameter of each of the projections and/or depressions is fixed, the first region can improve the light scattering property, and the second region can improve the light directivity. Controlling the height of each of the projections and/or depressions can improve both the light scattering property and the light directivity.

In the electro-optical apparatus, it is preferable that the height h1 may be in a range of 0.4 μm to 4 μm and the height h2 may be less than 0.4 μm.

According to this structure, the balance between the light scattering property and the light directivity can be adjusted in a predetermined range by adjustment of the height of each of the projections and/or depressions, and the definition in each viewing direction can be controlled in a desired range.

In the electro-optical apparatus, it is preferable that a ratio of an area of the first region to an area of the second region may be in a range of 10:90 to 90:10.

According to this structure, the ratio of light reflected from the first region to light reflected from the second region can be controlled in a predetermined range by use of a simple method, for example, changing the area ratio.

In the electro-optical apparatus, it is preferable that the base may have a display area including a reflecting region and a transmitting region, and the at least one of projections and depressions in each of the first region and the second region may be disposed in the reflecting region.

According to this structure, the electro-optical apparatus can have a display quality that is excellent in, in particular, the reflecting region.

In the electro-optical apparatus, it is preferable that the base may have a display area including a plurality of pixels, and at least one of the first region and the second region may include a plurality of subregions in each of the plurality of pixels.

According to this structure, the plurality of regions having different light scattering properties or different light directivities are provided in a single pixel. Therefore, a display quality that conforms to a wider angle of view can be obtained.

In the electro-optical apparatus, it is preferable that the second region may be a flat region having no projections and no depressions.

According to this structure, a display quality that is excellent in, in particular, the light directivity can be obtained.

According to a second aspect of the invention, a method for manufacturing an electro-optical apparatus including a base, a resin film on the base, and a light reflecting film is provided. The method includes applying a photosensitive resin material to the base and forming a resin film, performing pattern exposure on the resin film, forming the resin film by application of a developer to the resin film and forming a first region and a second region on a surface of the resin film in a pixel, a mode of the at least one of projections and depressions in the first region being different from a mode of the at least one of projections and depressions in the second region, and forming a light reflecting film on the resin film. A diffuse reflectivity of the first region is larger than a diffuse reflectivity of the second region.

That is, forming the plurality of regions having the projections and/or depressions of the different modes at the upper portion of the resin film by photolithography allows the shape of the projections and/or depressions to be adjusted by a plurality of factors, including a photomask, an exposure condition, and a development condition. Therefore, the desired projections and/or depressions can be formed with precision.

In the method, it is preferable that the pattern exposure may be performed by halftone exposure or by multistep exposure.

According to this, the exposure dose can be varied with respect to the depth direction of the resin film, and therefore, the desired projections and/or depressions can be formed more efficiently.

According to a third aspect of the invention, an electronic device includes the electro-optical apparatus described above.

Since the electronic device includes the electro-optical apparatus having an excellent light scattering property, the electronic device has reduced display unevenness and an excellent display quality.

BRIEF DESCRIPTION OF THE DRAWINGS

The invention will be described with reference to the accompanying drawings, wherein like numbers reference like elements.

DESCRIPTION OF EXEMPLARY EMBODIMENTS

First Embodiment

The first embodiment is an electro-optical apparatus including a base, a resin film on the base, the resin film having at least one of projections and depressions at an upper surface thereof, and a light reflecting film disposed on the at least one of projections and depressions. The resin film under the light reflecting film includes a first region and a second region. A mode of the at least one of projections and depressions in the first region is different from a mode of the at least one of projections and depressions in the second region. A diffuse reflectivity of the first region is larger than a diffuse reflectivity of the second region.

The first embodiment is illustrated below with reference to a TFT liquid crystal apparatus including a resin film being an interlayer dielectric to form an overlayer structure and projections and/or depressions for adjusting a viewing angle disposed at a surface of the resin film.

However, the first embodiment is merely one aspect of the invention and does not limit the invention. Any modification may be made without departing the scope of the invention.

Or example, the resin film may be disposed on an opposite substrate. Alternatively, the resin film may be a resin scattering film having projections and/or depressions. A switching element may be a TFD element in place of a TFT element. A passive-matrix liquid crystal apparatus, which has no switching element, may also be used.

1. Basic Structure of Liquid Crystal Apparatus

Figure 1A:
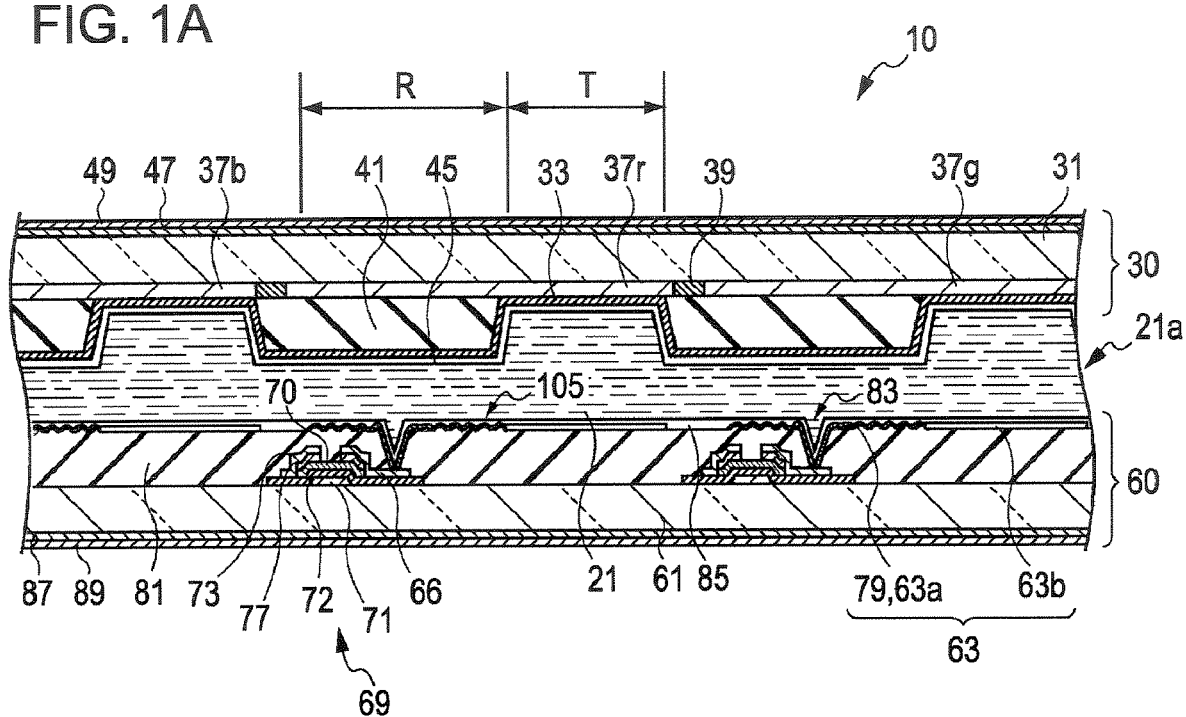
FIG. 1A is a section view of a liquid crystal apparatus according to an embodiment of the invention.
Figure 1B:
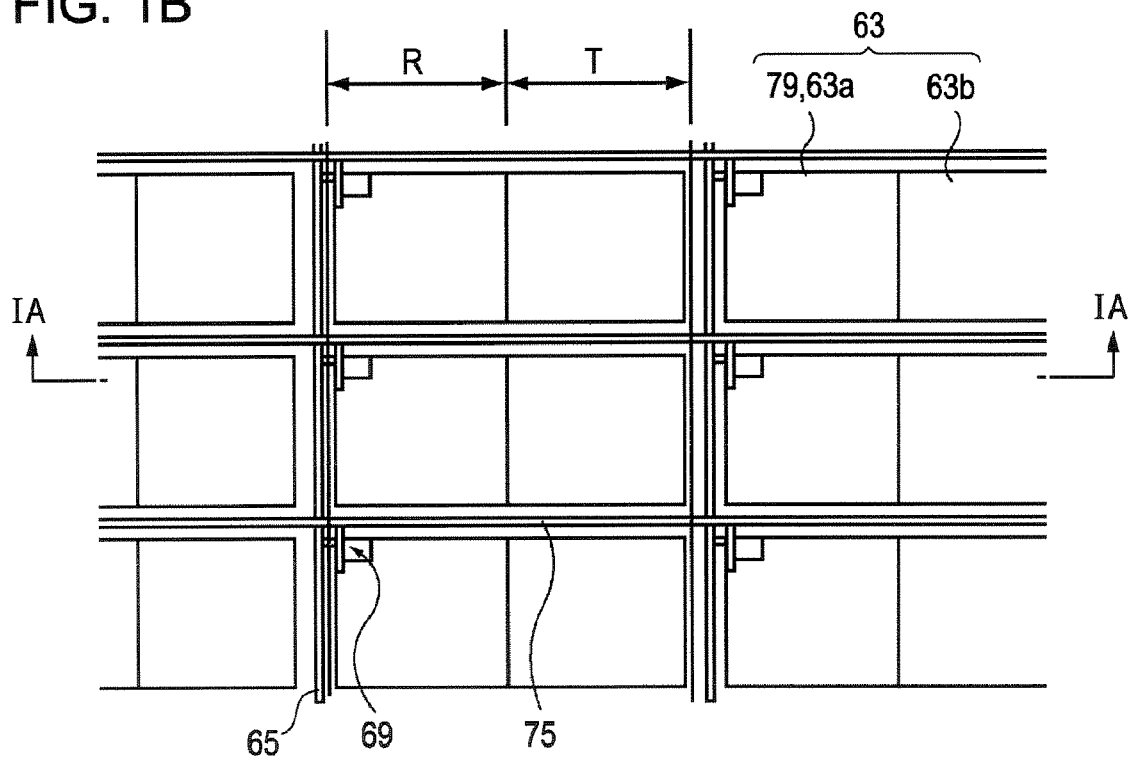
FIG. 1B is a plan view of an element substrate thereof.
Figure 2:
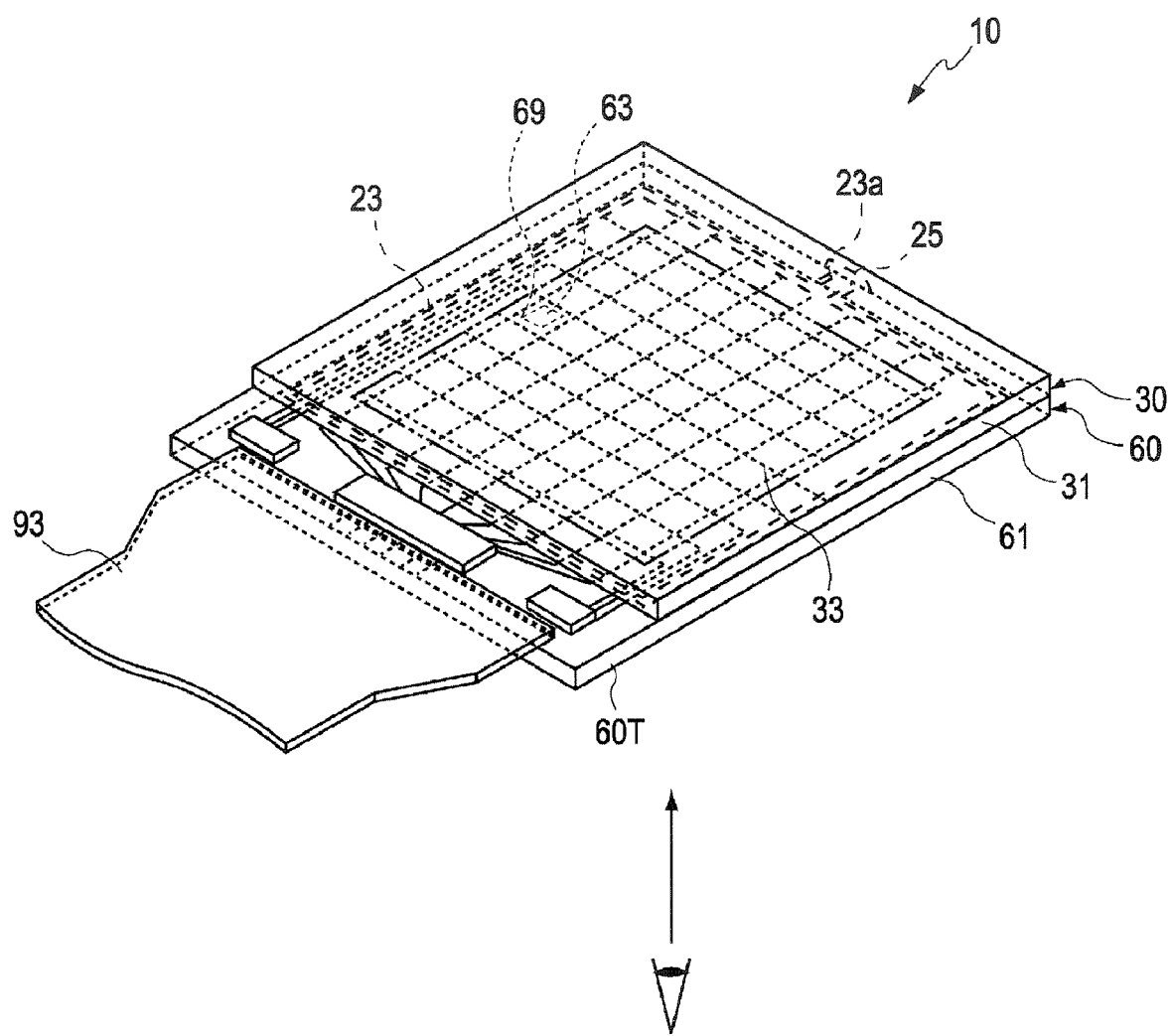
FIG. 2 is a perspective view of an electro-optical apparatus according to the embodiment of the invention.

A liquid crystal apparatus according to the first embodiment is described. FIG. 1A is a sectional view of a liquid crystal apparatus 10, and FIG. 1B is a plan view thereof. FIG. 1A is a sectional view taken along the line IA-IA in FIG. 1B. FIG. 2 is an external perspective view of the liquid crystal apparatus 10.

As shown in FIG. 1A, in the liquid crystal apparatus 10, an opposite substrate 30 and an element substrate 60 are bonded together at their outer areas with a sealant (not shown), and a gap enclosed by the opposite substrate 30, the element substrate 60, and the sealant is filled with a liquid crystal material 21. The liquid crystal apparatus 10 constitutes a so-called transreflective liquid crystal apparatus in which a display area is composed of a reflecting region R and a transmitting region T.

2. Element Substrate (1) Basic Structure

The element substrate 60, shown in FIG. 1A, is described below.

The element substrate 60 includes a base 61 made of a light-transmitting material, such as glass, a TFT element 69 as a switching element, and electrical wires, including a data line 75. The TFT element 69 and the electrical wires are disposed on the base 61. These components are generally covered by an interlayer dielectric 81, and electrical insulation between them is maintained.

A pixel electrode 63 made of a transparent conductive layer is disposed on a surface of the interlayer dielectric 81 in a region corresponding to the display area.

The pixel electrode 63 includes a pixel electrode 63a in the reflecting region R and a transparent electrode 63b in the transmitting region T. The pixel electrode 63a functions also as a light reflecting film 79 for performing display by reflection. The transparent electrode 63b is made of indium-tin oxide (ITO). The light reflecting film 79 as the pixel electrode 63a is made of a light reflecting material, such as aluminum or silver. An alignment film 85 made of polyimide resin is disposed on the pixel electrode 63. The alignment film 85 is subjected to rubbing as alignment processing.

(2) Interlayer Dielectric

As shown in FIGS. 1A and 1B, the interlayer dielectric 81 is an insulating film for performing isolation between the electrical wires or between the electrical wires and the switching element. The interlayer dielectric 81 is disposed at a substantially entire upper portion of the element substrate 60 so as to cover gate bus wires, source bus wires, and the TFT element 69.

A contact hole 83 is disposed in the interlayer dielectric 81 at a portion corresponding to a drain electrode 66. At the contact hole 83, the pixel electrode 63 and the drain electrode 66 of the TFT element 69 are communication with each other.

The interlayer dielectric 81 has projections and/or depressions 105 at a region corresponding to the reflecting region. The region where the projections and/or depressions 105 are disposed includes a first region and a second region. The mode of the projections and/or depressions 105 in the first region is different from that in the second region.

(3) Projections and/or Depressions

In this embodiment, the projections and/or depressions 105 at the upper surface of the interlayer dielectric 81 are disposed on the first and second regions, at which the projections and/or depressions 105 are of different modes between the first and second regions. The diffuse reflectivity of the first region is larger than that of the second region.

An expression of "the projections and/or depressions are of different modes" means that at least one of parameters, for example, the density of projections and/or depressions, the diameter of each projection or each depression, and the height of each projection or each depression is different.

An expression of "the diffuse reflectivity of the first region is larger than that of the second region" means that the quantity of diffuse reflected light in the first region is larger than that in the second region and means that regularly reflected light (reflected toward the front direction), in the first region is smaller than that in the second region.

These parameters can be varied singly or in combination.

The modes and advantages when each of the parameters is varied are described below.

(3)-1 Density

Figure 3A:
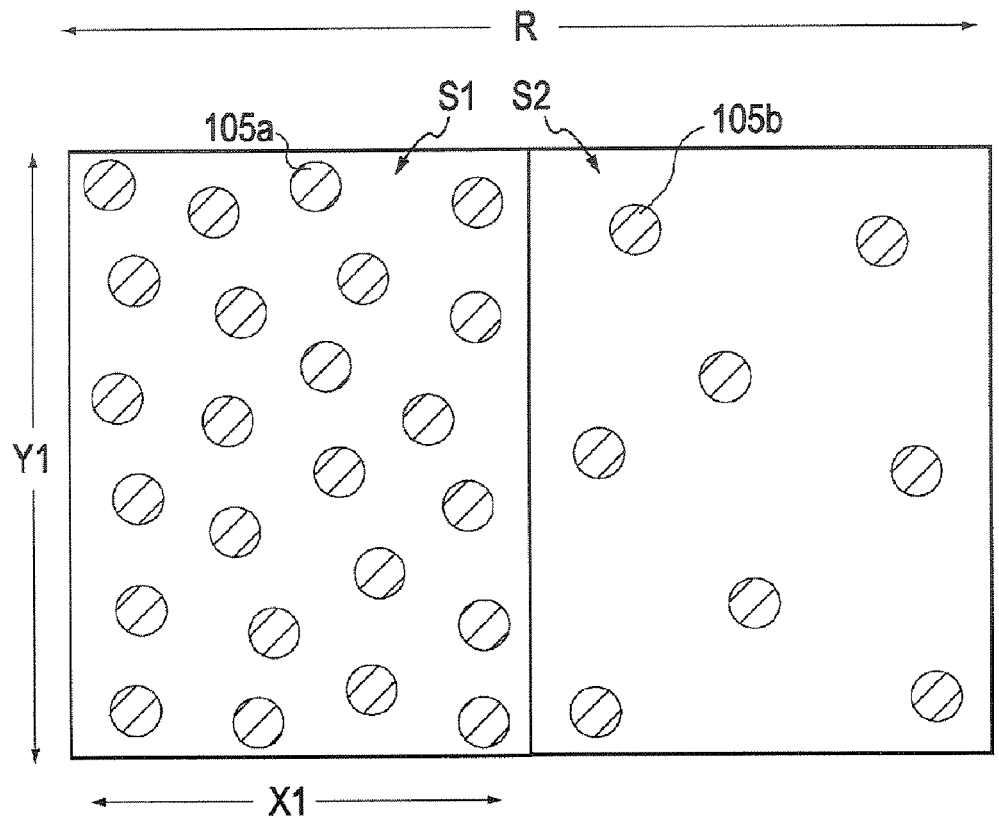
FIGS. 3A and 3B are schematic views for describing projections and/or depressions according to the embodiment of the invention.
Figure 3B:
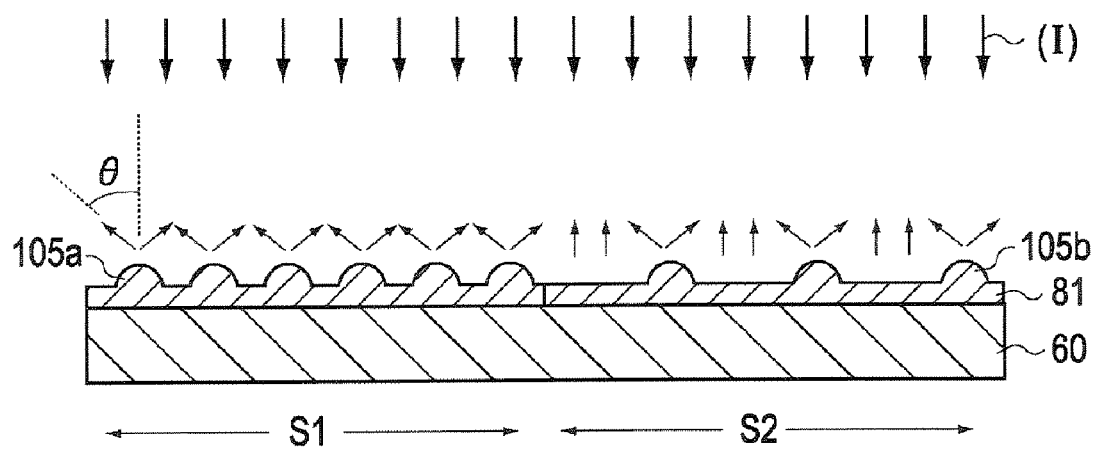

As shown in FIGS. 3A and 3B it is preferable that the interlayer dielectric 81 in the reflecting region R include a first region S1 and a second region S2 at the upper surface thereof, the first region S1 and a second region S2 having different densities of projections and/or depressions. More specifically, it is preferable that the density, $\rho 1$, of projections and/or depressions 105a in the first region S1 be larger than the density, $\rho 2$, of projections and/or depressions 105b in the second region S2.

This is because the provision of a plurality of regions having projections and/or depressions of different densities between the regions can offer an excellent balance between light reflected toward a direction of a wide viewing angle from a region that has a higher density and light reflected toward a front direction from a region that has a lower density.

As shown in FIG. 3B, the scattering angle, θ, of reflected light is defined by incident light and reflected light. As a result, in the case where incident light (I) is vertically incident on the substrate, light of a scattering angle of 0° refers to light reflected toward the front direction. An increase in the scattering angle increases the degree of scattering toward an oblique direction.

Figure 4:
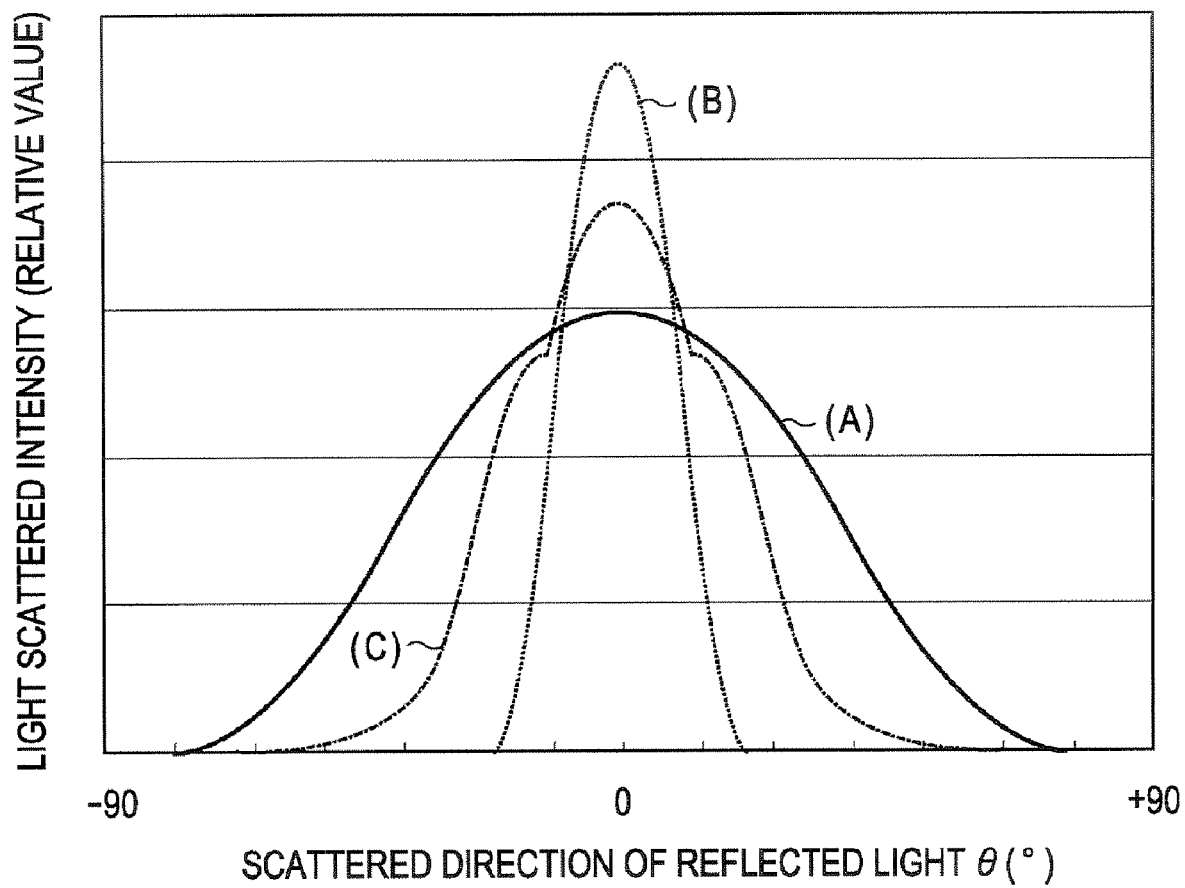
FIG. 4 is a characteristic curve showing a relationship between the density of the projections and/or depressions and the light scattering property.

FIG. 4 is a characteristic curve showing an effect of the density of each of the first and second regions on the light scattering property and light directivity.

For the characteristic curve, the horizontal axis represents the scattering directions of reflected light with respect to the incident directions of incident light, whereas the vertical axis represents the reflected light intensities corresponding to the respective scattering directions.

More specifically, a solid-line characteristic curve (A) is a graph of the light scattering property for a known case, i.e., a case in which projections and/or depressions having the same shape are irregularly arranged in a reflecting region.

A dotted line characteristic curve (B) represents a graph of the light scattering property when projections and/or depressions are not present in the reflecting region.

Furthermore, a dash-dot characteristic curve (C) is a graph of the light scattering property according to the first embodiment obtained when the density $\rho 1$ is 45% and the density $\rho 2$ is 0%.

The characteristic curve (C) exhibits a characteristic looking as if the characteristic curve (A) and the characteristic curve (B) are combined together and has two discontinuous steps in predetermined scattering directions. Each of the steps is a discontinuity occurring in a scattering direction where light reflected from the first region and light reflected from the second region overlap each other. An increase in the difference between the light intensities increases the degree of discontinuity of the curve at the discontinuities. The position and the degree of discontinuity can be changed as appropriate depending on the modes of projections and/or depressions in the first and second regions, the area ratio thereof, or the like.

As is evident from the characteristic curves, the provision of the second region having the density $\rho 2$ maintains the reflected light intensity in the front direction for a scattering angle of 0° within a tolerable range while the provision of the first region having the density $\rho 1$ improves the visibility from wider viewing directions.

For a specific numerical value of each of the density $\rho 1$ and the density $\rho 2$, it is preferable that the density $\rho 1$ be in a range of 30% to 60% and the density $\rho 2$ be less than 30%.

However, if the values of the density $\rho 1$ and the density $\rho 2$ are excessively large, only the visibility from wider viewing directions may be increased, and as a result, the display quality may be decreased.

On the contrary, if the values of the density $\rho 1$ and the density $\rho 2$ are excessively small, only the visibility from the front direction may be increased, and as a result, the display quality may also be decreased.

Accordingly, the density $\rho 1$ may be in a range of, preferably, 35% to 55%, and more preferably, 40% to 50%.

The density $\rho 2$ may be in a range of, preferably, 0% to 25%, and more preferably, 0% to 15%.

In the second region, it is also preferable that the density $\rho 2$ be 0%, i.e., the second region be a flat region having no projections and/or depressions.

This is because the absence of projections and/or depressions can noticeably increase reflection toward the front direction and a display quality of excellent visibility from the front direction can be obtained.

For the term "the density" used in the specification, for example, the density $\rho 1$ refers to a ratio of an area occupied by projections and/or depressions to the area of the first region. More specifically, in FIG. 3A, the density $\rho 1$ is represented by $\rho 1 = (Sa \times N)/(S1) \times 100 (\%)$ where X1 represents the width of the first region, Y1 represents the length of the first region, S1 represents the area of the first region ($= X1 \times Y1$), Sa represents the plane area of one of the projections and/or depressions 105a, and N represents the number of the projections and/or depressions.

(3)-2 Height

Figure 5A:
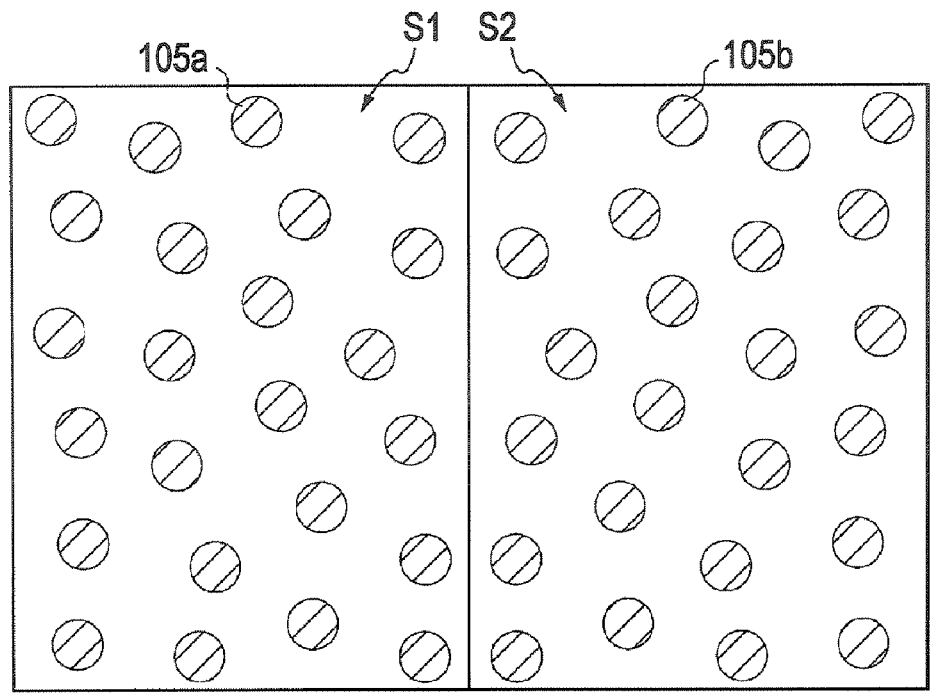
FIGS. 5A and 5B illustrate a relationship between the height of each of the projections and/or depressions and the light scattering property.
Figure 5B:
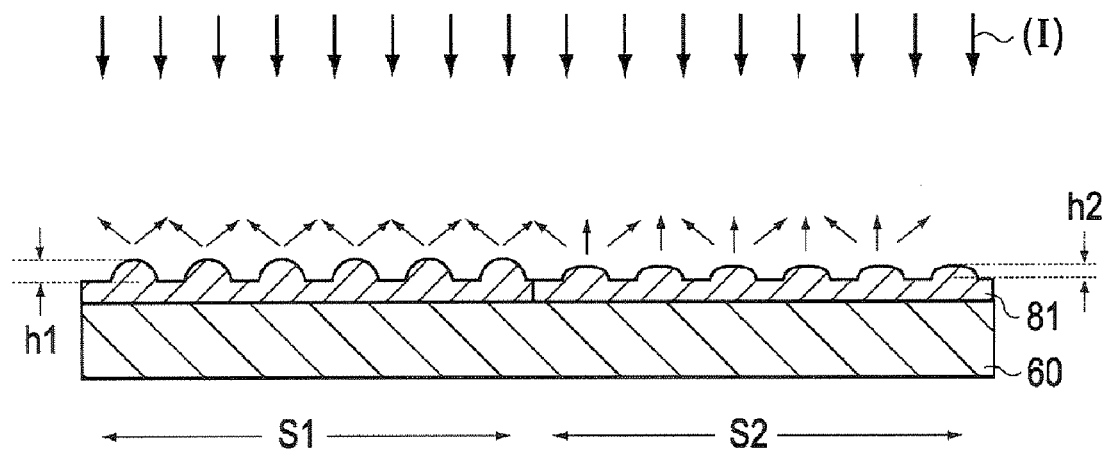

As shown in FIGS. 5A and 5B, it is preferable that the interlayer dielectric 81 include the first region S1 and the second region S2 at the upper portion thereof, the height of each of projections and/or depressions in the first region S1 being different from that in the second region S2.

This is because the scattering directions of reflected light can be controlled by adjustment of the height of each of the projections and/or depressions, and therefore, a desired light scattering property and light directivity can be obtained.

More specifically, as shown in FIGS. 5A and 5B, for the projections and/or depressions 105a and 105b having substantially the same diameter, at a region having relatively high projections and/or depressions, the scattering angle is large with respect to incident light, so the region exhibits a high light scattering property. In contrast, at a region having relatively low projections and/or depressions, the scattering angle is small with respect to the incident light, and reflection toward the front direction is large. As a result, the region exhibits a high light directivity.

Accordingly, the provision of a plurality of regions having different heights can efficiently control the light intensity for each scattering direction.

For a specific numerical value of the height of each of the projections and/or depressions 105, it is preferable that the height, h1, of each of the projections and/or depressions 105a in the first region S1 be in a range of 0.4 μm to 4 μm and the height, h2, of each of the projections and/or depressions 105b in the second region S2 be less than 0.4 μm.

This is because the scattering directions can be controlled within a predetermined range by using values within such ranges.

However, if the height h1 is larger than 4 μm or the height h2 is equal to or larger than 0.4 μm, only the visibility from wider viewing directions may be increased, and as a result, the display quality may be decreased.

On the contrary, if the height h1 is smaller than 0.4 μm or the height h2 is excessively small, only the visibility from the front direction may be increased, and as a result, the display quality may also be decreased.

Accordingly, the height h1 may be in a range of, preferably, 1.0 μm to 3.0 μm, and more preferably, 1.5 μm to 2.5 μm.

The height h2 may be in a range of, preferably, 0.1 μm to 0.3 μm, and more preferably, 0.15 μm to 0.25 μm.

(3)-3 Diameter

Figure 6A:
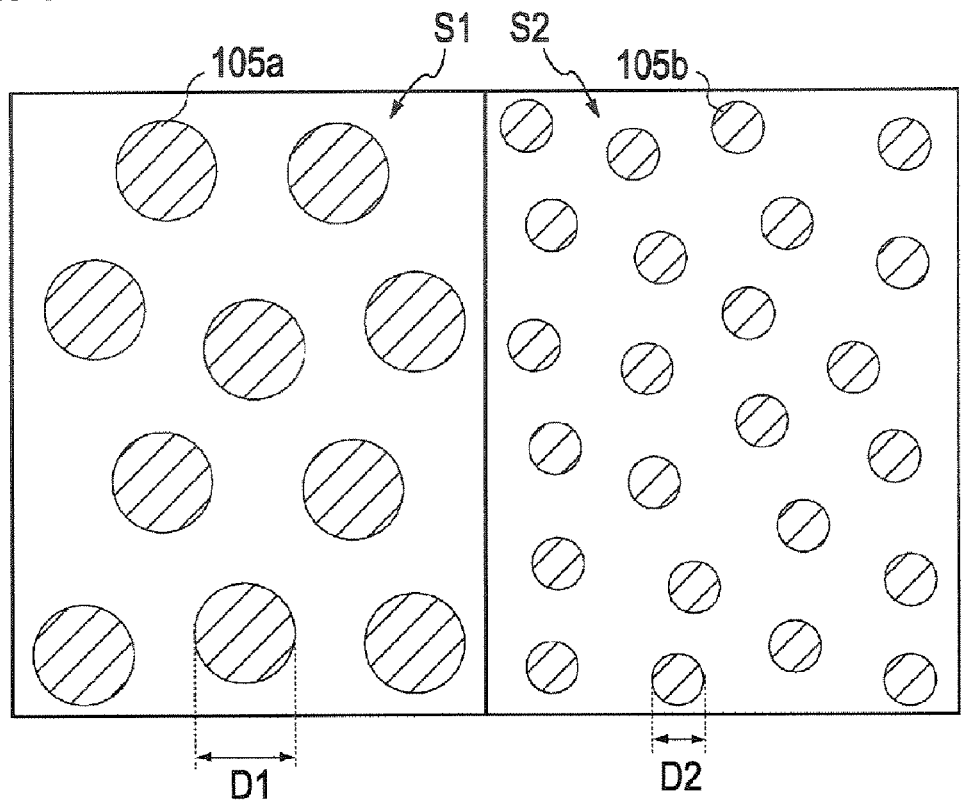
FIGS. 6A and 6B illustrate a relationship between the diameter of each of the projections and/or depressions and the light scattering property.
Figure 6B:
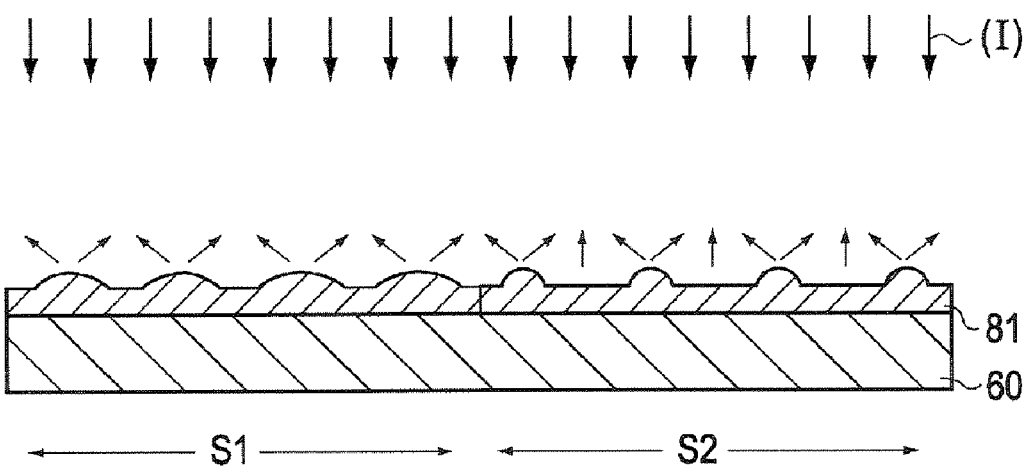

As shown in FIGS. 6A and 6B, it is preferable that the interlayer dielectric 81 include the first region S1 and the second region S2 at the upper surface thereof, the diameter of each of the projections and/or depressions in the first region S1 being different from that in the second region S2.

This is because the scattering directions of reflected light can be controlled by adjustment of the diameter of each of the projections and/or depressions, and therefore, a desired light scattering property and light directivity can be obtained with a simple manner.

The term "the diameter" used herein refers to the diameter of a circle when the projections and/or depressions are viewed from a direction of the plane of the substrate, and more specifically, corresponds to D1 or D2 in FIG. 6A.

When the shape of each of the projections and/or depressions 105a and 105b viewed from the direction of the plane is not circular, the diameter of a perfect circle having the same area as the shape, i.e., an equivalent-circle diameter is used.

For the relationship between the diameter of each of projections and/or depressions and each of the light scattering property and the light directivity, as shown in FIGS. 6A and 6B, at a region having the projections and/or depressions of a relatively larger diameter, the ratio of an area occupied by the oblique portions of the projections and/or depressions to the entire area is relatively large, so that the visibility from wider viewing directions is improved. In contrast, at a region having the projections and/or depressions of a relatively small diameter, the ratio of an area occupied by the oblique portions of the projections and/or depressions to the entire area is small, and the ratio of an area occupied by a planer portion is larger. As a result, the visibility from the front direction is improved.

More specifically, it is preferable that the equivalent-circle diameter $\phi1$ be in a range of 4 μm to 12 μm and the equivalent-circle diameter $\phi2$ be less than 4 μm.

This is because the above-described scattering directions can be controlled within a predetermined range by using values within such ranges, and therefore, a desired light scattering property and light directivity can be obtained.

However, if the equivalent-circle diameter $\phi1$ is larger than 12 μm or the equivalent-circle diameter $\phi2$ is equal to or larger than 4 μm, only the visibility from wider viewing directions may be increased, and as a result, the display quality may be decreased.

On the contrary, if the equivalent-circle diameter $\phi1$ is smaller than 4 μm or if the equivalent-circle diameter $\phi2$ is excessively small, only the visibility from the front direction may be increased, as a result, the display quality may also be decreased.

Accordingly, the equivalent-circle diameter $\phi1$ may be in a range of, preferably, 6 μm to 10 μm, and more preferably, 7 μm to 9 μm.

The equivalent-circle diameter $\phi2$ may be in a range of, preferably, 1 μm to 3 μm, and more preferably, 1.5 μm to 2.5

(3)-4 Area Ratio

It is preferable that the ratio of the area of the first region S1 to that of the second region S2 (S1:S2) be in a range of 10:90 to 90:10.

This is because, when the first region is assigned to reflection toward wider viewing directions and the second region is assigned to reflection toward the front direction, as described above, the light intensities toward the respective directions can be controlled by adjustment of the area ratio, and therefore, a desired light scattering property and light directivity can be obtained with a simple manner.

Figure 7:
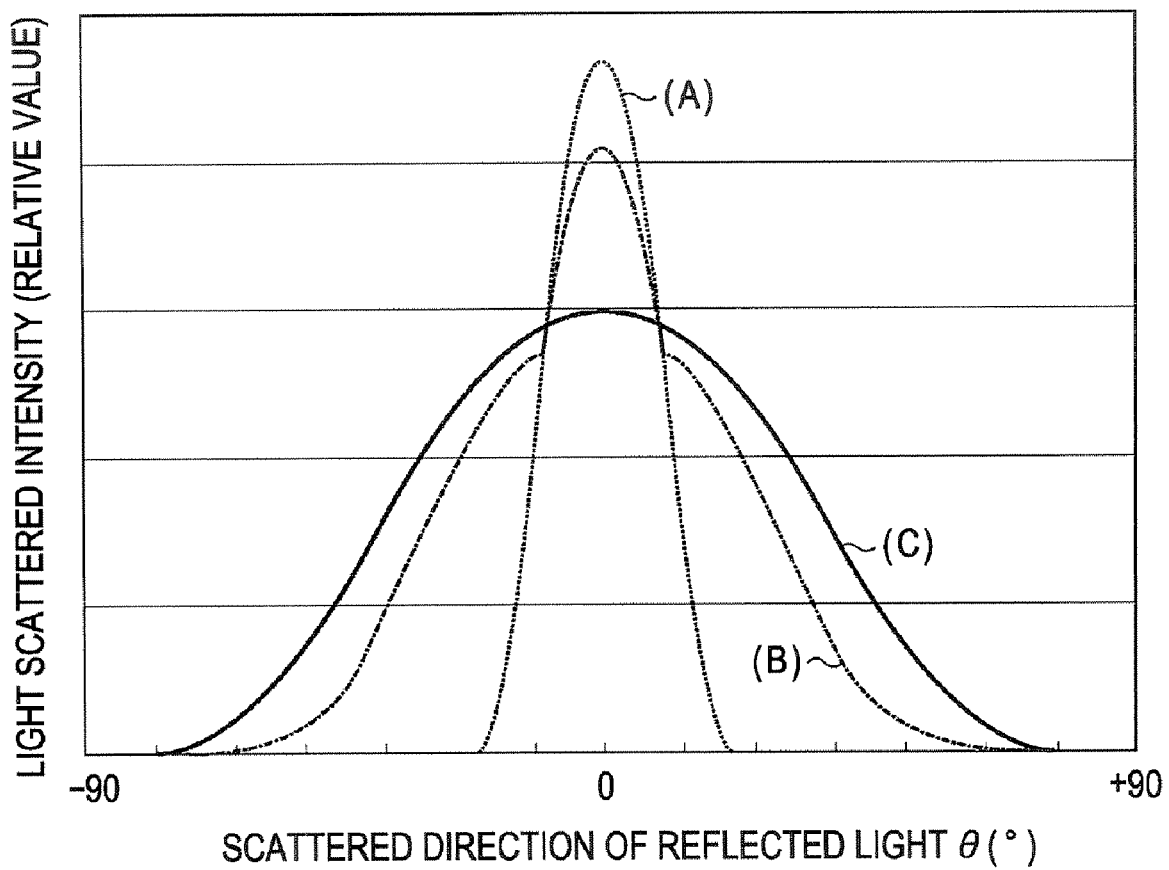
FIG. 7 is a characteristic curve showing a relationship between the area ratio and the light scattering property.

FIG. 7 is a characteristic curve showing a relationship between the area ratio (S1:S2) and each of the light scattering property and the light directivity.

For the characteristic curve, the horizontal axis represents the scattering direction of reflected light with respect to the direction of the normal to the substrate, whereas the vertical axis represents the reflected light intensities corresponding to the respective scattering directions.

A characteristic curve (A) is a graph of the light scattering property for an area ratio (S1:S2) of 10:90. A characteristic curve (B) represents a graph of the light scattering property for an area ratio of 50:50. A characteristic curve (C) is a graph of the light scattering property for an area ratio of 90:10.

As is evident from the characteristic curves, changing the area ratio of the first region S1 to the second region S2 can change the characteristic curve from (A) to (C). For example, as the area of the first region increases, the characteristic curve changes from (A) to (B) to (C).

However, because there are few practical applications for the characteristic curves (A) and (C), except when the visibility from a specific direction is intended to be enhanced to an extreme, the area ratio may be in a range of, preferably, 20:80 to 80:20, and more preferably, 40:60 to 60:40.

Two discontinuities of the characteristic curve (B) are similar to the discontinuities described above with reference to FIG. 4. That is, the position and the degree of discontinuity can be changed as appropriate depending on the density of projections and/or depressions in the first and second regions, the height of each of the projections and/or depressions, the diameter thereof, the area ratio, or the like.

(3)-5 Two-dimensional Arrangement

Figure 8A:
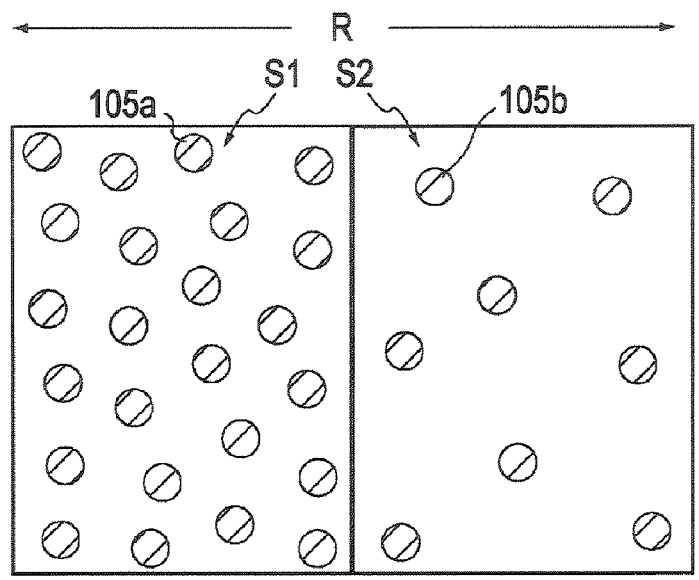
FIGS. 8A through 8C are plan views showing two-dimensional arrangements in a first region and a second region according to a preferred embodiment.
Figure 8B:
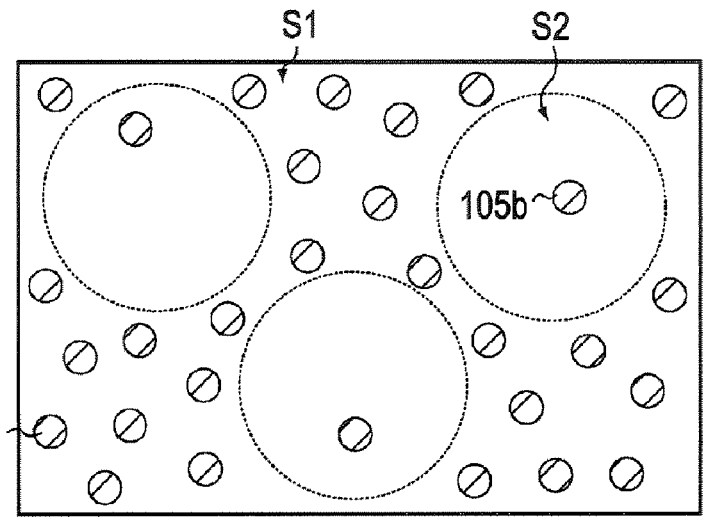
Figure 8C:
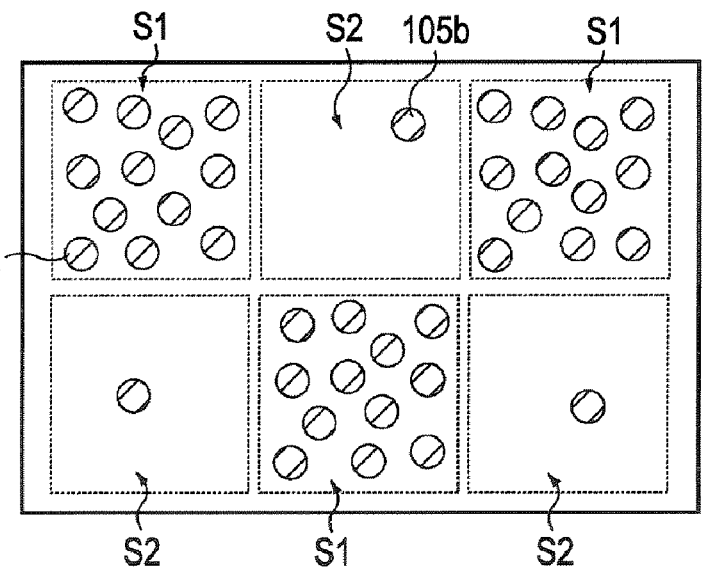

As shown in FIGS. 8A to 8C, the two-dimensional arrangement of the first region and the second region can be changed as appropriate according to their modes.

More specifically, as shown in FIG. 8A, it is preferable that, in one pixel, the projections and/or depressions 105a are disposed in the first region S1 and the projections and/or depressions 105b are disposed in the second region S2 such that the reflecting region R is divided into two sections.

This is because arranging the first region and the second region separately without mixing them together can provide a simple structure, and therefore, design and manufacture are facilitated.

Alternatively, it is preferable that, in one pixel, at least one of the first region and the second region include a plurality of subregions.

One example is that, as shown in FIG. 8B, it is preferable that the first region S1 be disposed over a pixel and a plurality of second subregions S2 be disposed within the pixel.

This is because the provision of the plurality of second subregions allows the scattering directions to be different for each subregion, and therefore, a more complex light scattering property can be obtained.

Alternatively, as shown in FIG. 8C, it is preferable that, in one pixel, each of the first regions S1 and the second region S2 include a plurality of subregions.

This is because, compared with FIG. 8B, the scattering directions can be further different for each subregion, and therefore, a much more complex light scattering property can be obtained.

When at least one of the first region and the second region includes a plurality of subregions, the two-dimensional shape of each of the subregions may be circular, as shown in FIG. 8B, or may be rectangular, as shown in FIG. 8C.

In the two-dimensional shape as shown in FIGS. 8A to 8C, it is preferable that the projections and/or depressions 105 be irregularly arranged.

This is because, if the projections are arranged by a rule, reflected light beams may interfere with each other according to the rule, interference fringes may occur in the display area, and thus display quality may be degraded.

(4) TFT Element

As shown in FIG. 1A, a TFT element 69 as a switching element includes a gate electrode 71 on the base 61, a gate insulator 72 on the gate electrode 71 throughout the element substrate 60, a semiconductor layer 70 disposed above the gate electrode 71, a contact electrode 77, a source electrode 73 on a first end of the semiconductor layer 70, and the drain electrode 66 on a second end of the semiconductor layer 70. The gate insulator 72 is disposed between the gate electrode 71 and the semiconductor layer 70. The contact electrode 77 is disposed between the semiconductor layer 70 and the source electrode 73 and between the semiconductor layer 70 and the drain electrode 66.

The gate electrode 71 extends from the gate bus wires (not shown). The source electrode 73 extends from the source bus wires (not shown). The gate bus wires extend in the width direction of the element substrate 60 and are arranged in parallel with each other at equal intervals in the longitudinal direction. The source bus wires extend in the longitudinal direction so as to intersect the gate bus wires via the gate insulator 72 and are arranged in parallel at equal intervals in the width direction.

The gate bus wires are connected to a liquid-crystal driving IC (not shown) and acts as, for example, a scanning line. The source bus wires are connected to another liquid-crystal driving IC (not shown) and acts as, for example, a signal line.

The pixel electrode 63 is disposed at a region in which a region corresponding to the TFT element 69 is removed from a rectangular region defined by the intersecting gate bus and source bus wires.

Examples of a material of each of the gate bus wires and the gate electrode include chromium and tantalum. Examples of a material of the gate insulator include silicon nitride (SiNx) and silicon oxide (SiOx). Examples of a material of the semiconductor layer include doped amorphous silicon (a-Si), polycrystalline silicon, and cadmium selenide (CdSe) Examples of a material of the contact electrode include a-Si. Examples of a material of each of the source electrode, the source bus wires integral therewith, and the drain electrode include titanium, molybdenum, and aluminum.

3. Structure of Opposite Substrate

The opposite substrate 30 includes a base 31 made of glass, plastic, or the like, a color filter, i.e., a color layer 37 on the base 31, a common electrode 33 on the color layer 37, and an alignment film 45 on the common electrode 33. The opposite substrate 30 includes an insulating layer 41 for optimizing retardation. The insulating layer 41 is disposed between the color layer 37 and the common electrode 33 in the reflecting region R.

The common electrode 33 is a planer electrode disposed over a surface of the base 31. Examples of a material of the common electrode 33 include ITO. The color layer 37 includes one of color filter elements corresponding to red (R), green (G), and blue (B), or corresponding to cyan (C), magenta (M), and yellow (Y). The color layer 37 faces the pixel electrode 63. A black matrix 39 is disposed adjacent to the color layer 37 at a position that does not face the pixel electrode 63.

A retardation plate 47 is disposed on the outer surface of the opposite substrate 30 (i.e., at the upper side in FIG. 1A). A polarizer 49 is disposed on the retardation plate 47. Similarly, a retardation plate 87 is disposed on the outer surface of the element substrate 60 (i.e., at the lower side in FIG. 1A). A polarizer 89 is disposed under the retardation plate 87. A backlight unit (not shown) is disposed below the element substrate 60.

Second Embodiment

The second embodiment is a method for manufacturing an electro-optical apparatus including a base, a resin film on the base, and a light reflecting film is provided. The method includes applying a photosensitive resin material to the base and forming a resin film, performing pattern exposure on the resin film, forming the resin film by application of a developer to the resin film and forming a first region and a second region on a surface of the resin film in a pixel, a mode of the at least one of projections and depressions in the first region being different from a mode of the at least one of projections and depressions in the second region, and forming a light reflecting film on the resin film. A diffuse reflectivity of the first region is larger than a diffuse reflectivity of the second region.

The method for manufacturing a liquid crystal apparatus according to the second embodiment is illustrated below with reference to a method for manufacturing a transreflective liquid crystal apparatus, the method including forming an interlayer dielectric as a resin film and forming projections and/or depressions for adjusting a viewing angle at a surface of the interlayer dielectric.

However, the second embodiment is merely one aspect of the invention and does not limit the invention. Any modification may be made without departing the scope of the invention.

For example, the resin film may be disposed on an opposite substrate. Alternatively, the resin film may be a resin scattering film, and a light reflecting film may be disposed on a surface of the resin film.

Figure 9A:
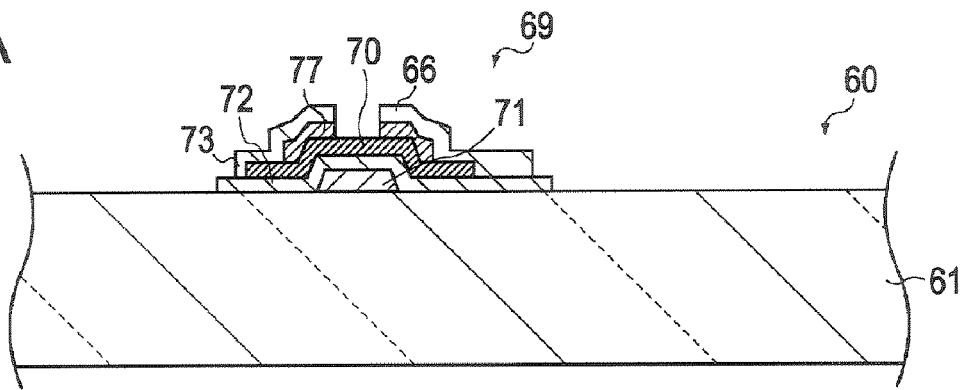
FIGS. 9A through 9C are a first series of sectional views of a process of manufacturing an element substrate.

1. Processes for Manufacturing Element Substrate (1) Process of Forming a TFT Element First, a process of forming a TFT element is performed. The process of forming a TFT element is a process of forming a switching element, such as a TFT element, by forming a metal film and an insulating film on a base of an element substrate and carrying out patterning, as shown in FIG. 9A.

To form the switching element, the gate electrode 71 is formed on the base 61. The gate electrode 71 may be made of a low resistance material, such as chromium, tantalum, and molybdenum, and can be formed by sputtering or electron-beam evaporation.

Next, the gate insulator 72 as an insulating layer can be formed on the gate electrode 71 by depositing an electrical insulating material, such as silicon nitride (SiNx) or silicon oxide (SiOx), thereon.

Then, the semiconductor layer 70 can be formed on the gate insulator 72 by depositing a semiconductor material, such as a-Si, polycrystalline silicon, or cadmium selenide (CdSe). In addition, the contact electrode 77 can be formed from doped a-Si on both ends of the semiconductor layer 70.

Finally, the source electrode 73, the source bus wires integral therewith, and the drain electrode 66 can be formed so as to be in contact with the contact electrode 77. At this time, the source electrode 73, the source bus wires (not shown), and the drain electrode 66 can be formed from a low resistance material, for example, titanium, molybdenum, or aluminum, by sputtering or electron-beam evaporation.

(2) Process of Forming Interlayer Dielectric

Next, a process of forming an interlayer dielectric is performed. As shown in FIGS. 9B to 10B, the process of forming an interlayer dielectric includes an application process of applying a photosensitive resin material to the base 61 and forming a resin layer 81X, an exposure process of performing pattern exposure on the resin layer 81X by use of a predetermined exposure apparatus, a development process of developing the resin layer 81X by applying a developer thereto and forming the resin film 81, and a heat process of heating the interlayer dielectric 81 and maintaining the interlayer dielectric 81 at a predetermined temperature to cure the interlayer dielectric 81.

(2)-1 Application Process

Figure 9B:
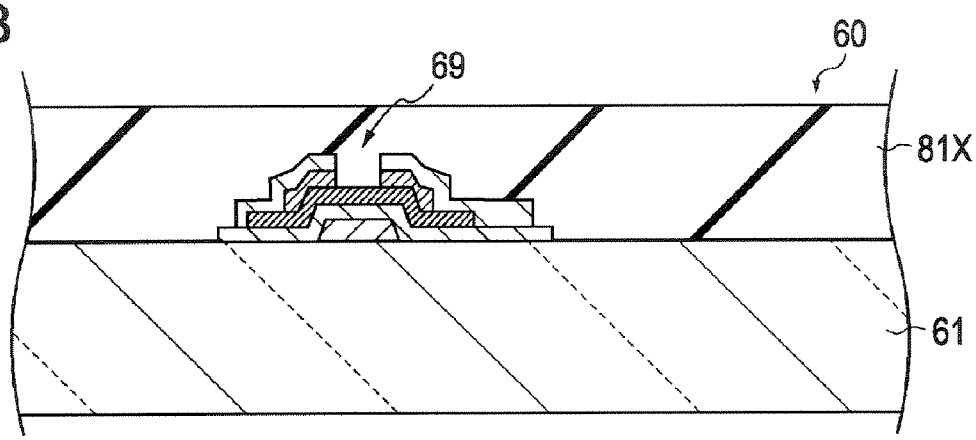

As shown in FIG. 9B, the application process is a process of applying a photosensitive resin material to the base 61 and forming the resin layer 81X. At this time, the photosensitive resin material can be either the positive type, which renders an exposed portion soluble, or the negative type, which renders an exposed portion insoluble. Both types can be suitably used. This embodiment is illustrated with reference to the positive type.

The thickness of the resin layer 81X can be changed depending on exposure conditions and is not limited to a specific value. However, if the resin layer 81X is excessively thin, the surface of the base may be partially exposed, resulting in the occurrence of pattern defects. On the other hand, if the resin layer 81X is excessively thick, workability may be degraded in the development process, which is described below. Accordingly, the thickness of the resin layer 81X may be in a range of, preferably, 0.1 µm to 10 µm, and more preferably, 1 µm to 5 µm.

(2)-2 Exposure Process

Figure 9C:
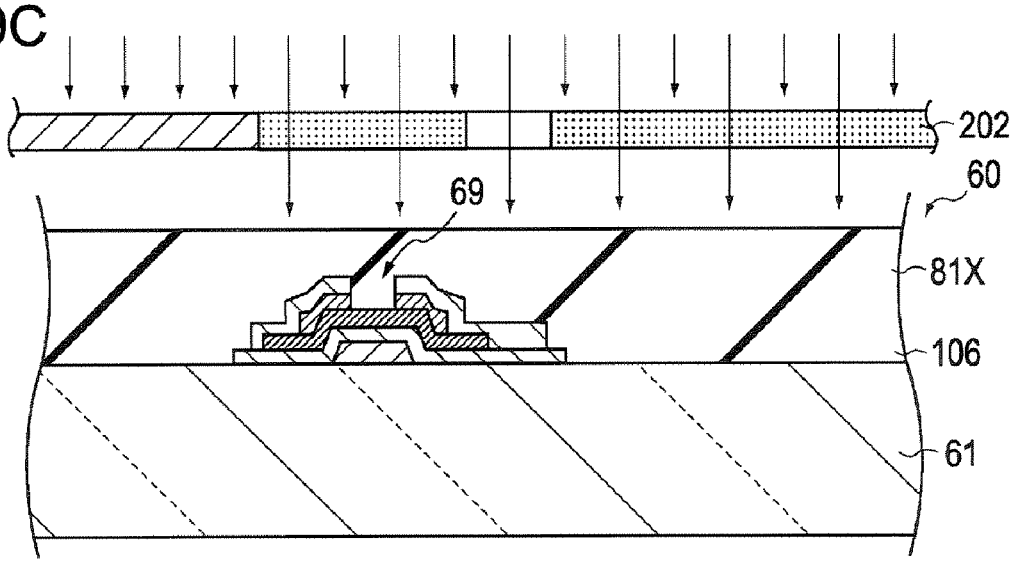

As shown in FIG. 9C, the exposure process is a process of performing pattern exposure by partially exposing the resin layer 81X by irradiating the resin layer 81X with an energy beam such as i-line, through a photomask 202 disposed above the base 61.

Preferably, although not limited thereto, the photomask 202 may be a halftone mask, in which light transmittance is partially varied, for example.

This is because, in forming projections and/or depressions at the surface of the resin layer 81X, the exposure dose can be minutely varied with respect to the depth direction, and therefore, finer projections and/or depressions can be formed.

Another exposure method is multistep exposure, which performs exposure multiple times while changing the intensity of irradiation with the energy beam, and this method is also preferable.

This is because, as in the case of use of a halftone mask, the exposure dose can be varied with respect to the depth direction of the resin layer 81X, and therefore, more complex and finer projections and/or depressions can be formed.

(2)-3 Development Process

Figure 10A:
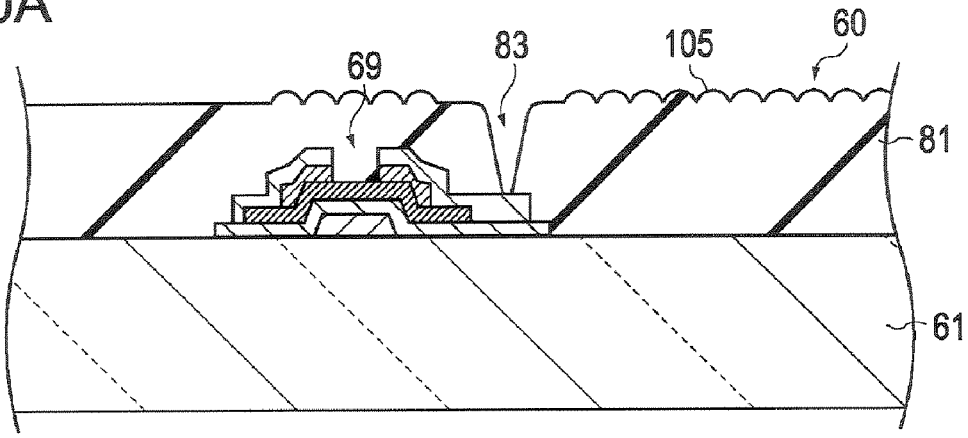
FIGS. 10A through 10C are a second series of sectional views of the process of manufacturing the element substrate.

As shown in FIG. 10A, the development process is a process of forming the interlayer dielectric 81 by applying a predetermined developer to the resin layer 81X with a latent image.

As shown in FIG. 10A, the development process is a process of applying a predetermined developer to the resin layer in which a latent image has been formed, forming a pattern, and forming the interlayer dielectric 81 having a predetermined shape. At this time, the developer may be dropped while being moved in parallel with the plane of the substrate, or may be provided in the form of a mist from a shower nozzle disposed above the center of the substrate.

If the nozzle has a slit shape, the projections and/or depressions 105 can be asymmetrically formed by changing the movement speed. This is applicable to a case in which enhancement of the visibility in a specific scattering direction is intended.

(2)-4 Heat Process

Figure 10B:
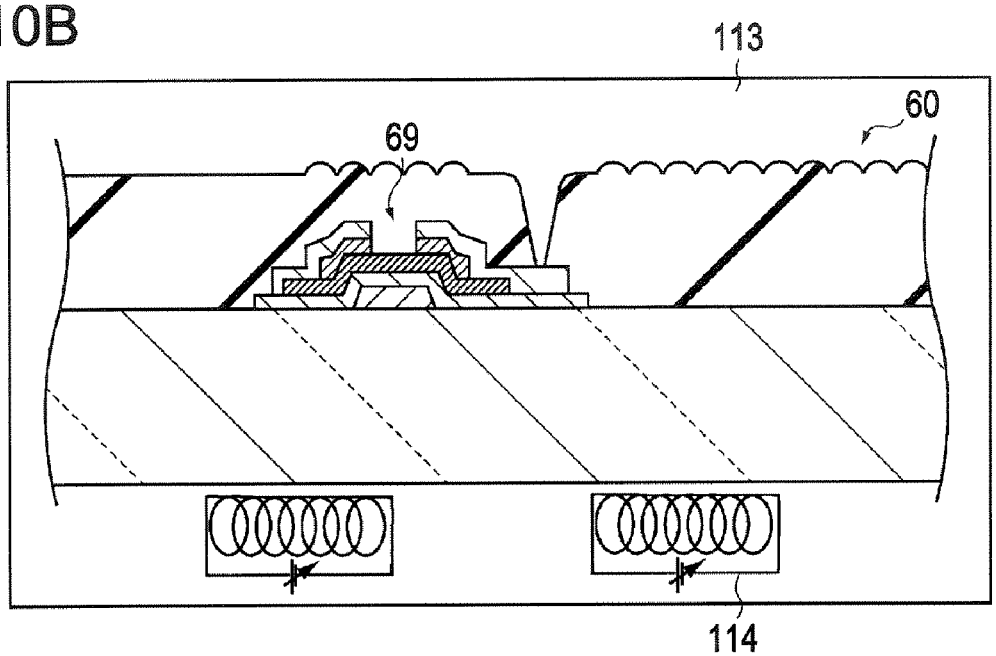

As shown in FIG. 10B, the heat process is a process of thermosetting the interlayer dielectric 81 and stabilizing the shape thereof by heating the interlayer dielectric 81 patterned into a predetermined shape with a predetermined condition.

As shown in FIG. 10B, the heat process can be performed by storing the element substrate 60 inside a heating apparatus 113 incorporating a heater 114. More specifically, for example, the heat process can be performed with a condition of a heat time of 1 to 60 minutes and a heat temperature of 150° C. to 250° C.

Depending on a condition for the heat process, the curved shape of the projections and/or depressions can be changed into a predetermined shape, and the light scattering property can be controlled.

(3) Process of Forming Light Reflecting Film

Figure 10C:
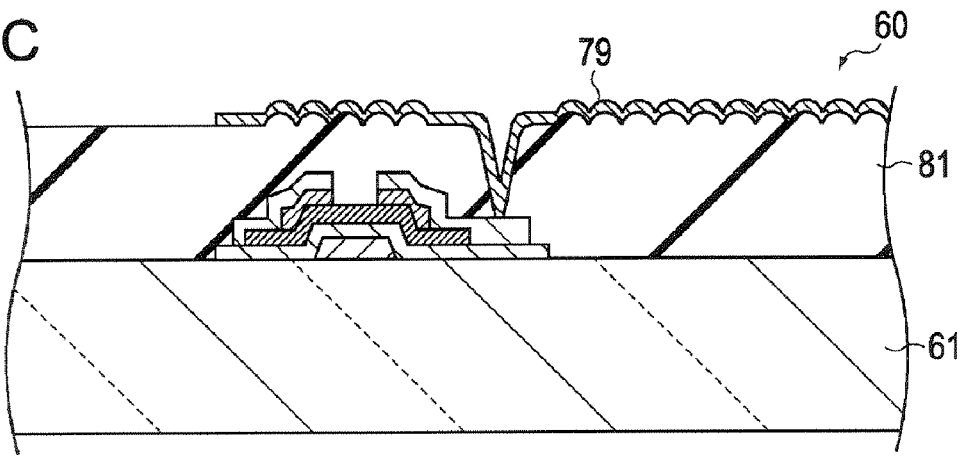

As shown in FIG. 10C, the process of forming a light reflecting film is a process of forming the light reflecting film 79 made of a light-reflective material on a region having the projections and/or depressions of the interlayer dielectric 81 at.

As shown in FIG. 10C, the process of forming a light reflecting film can selectively form the light reflecting film 79 on the projections and/or depressions 105 by depositing a light-reflective material, such as aluminum, on the interlayer dielectric 81 by a known vapor deposition technique, such as sputtering or electron-beam evaporation, and then performing predetermined patterning on the formed film.

(4) Process of Forming Pixel Electrode

A process of forming a pixel electrode includes a process of forming a pixel electrode by evaporation of a transparent conductive layer and a process of forming an alignment film for controlling the alignment of a liquid crystal material.

Figure 11A:
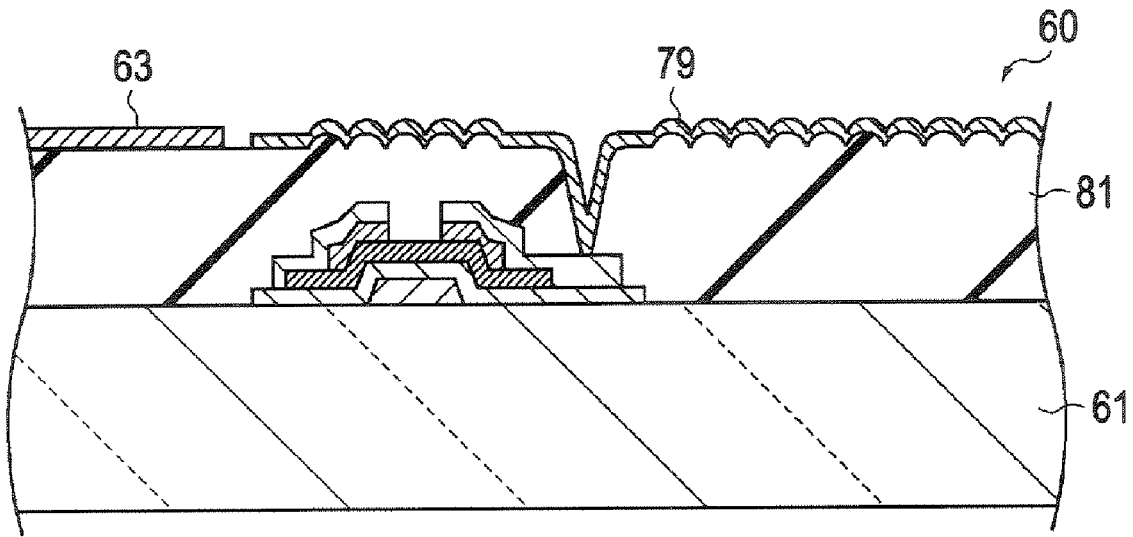
FIGS. 11A and 11B are a third series of sectional views of the process of manufacturing the element substrate.

More specifically, as shown in FIG. 11A, the pixel electrode 63 is formed by formation of the transparent conductive layer by sputtering or other techniques at a position facing the common electrode.

Figure 11B:
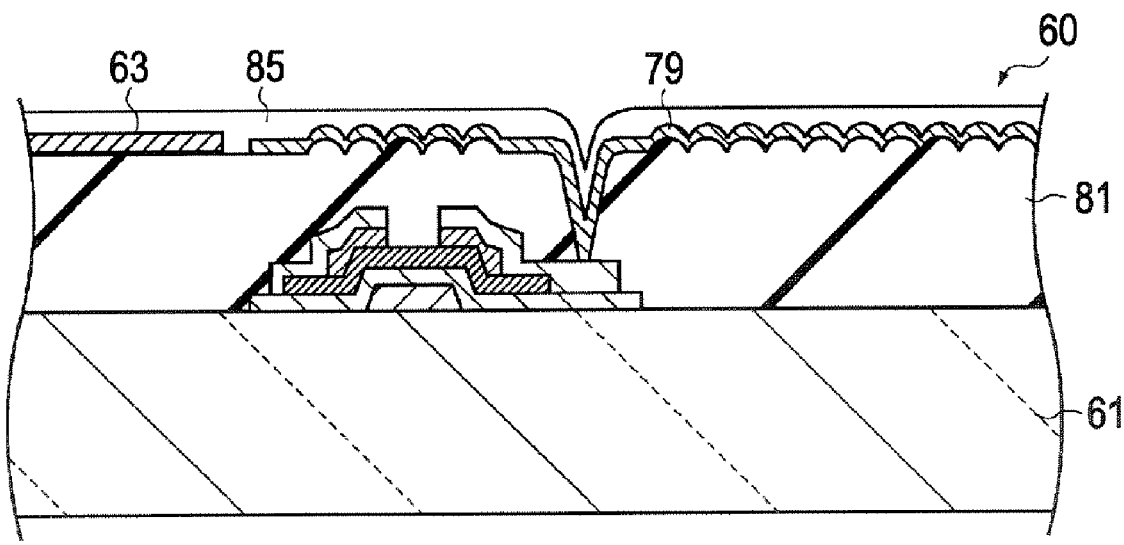

Then, as shown in FIG. 11B, the alignment film 85, which is made of polyimide resin, is formed on an image display area. The alignment film 85 can become an alignment film that can control the alignment of the liquid crystal material by being subjected to rubbing with a predetermined rubbing member.

2. Process of Manufacturing Opposite Substrate (1) Process of Forming Color Filter Next, a process of forming a color filter is performed. The process of forming a color filter includes a process of forming on the base 31 the black matrix 39, which has a plurality of openings corresponding to respective pixel regions, a process of forming the color filter layer 37, and a process of forming the thickness adjusting layer 41 for adjusting retardation, as shown in FIG. 1A.

Examples of the black matrix 39 include a metal film, such as a chromium film or molybdenum film, a layer in which coloring materials of three colors, red, green, and blue, are dispersed in a resin base or other known bases, and a layer in which a coloring material, such as a pigment or dye, of black is dispersed in a resin base or other known bases. However, the metal film made of chromium is preferable because it can maintain a light shielding property even if it is thin and because a step caused by the black matrix 39 can be reduced.

To form the black matrix 39 by using such a metal film, for example, a metal material, such as chromium, is deposited on the base 31 by evaporation, and then, the layer can be etched so as to be shaped into a predetermined pattern.

Next, as shown in FIG. 1A, the color filter layer 37 can be formed by application of a photosensitive resin made of, for example, a transparent resin in which a coloring material, such as pigment or dye, is dispersed to the base 31 on which black matrix 39 has been formed by use of a spin coater or slit coater and by sequentially performing pattern exposure and development on the applied layer. By repetition of this process of each color, color filter layers 37*r*, 37*g*, and 37*b* for a plurality of colors are arranged.

Then, a photocurable or heat-curable resin material is applied over the base 31, and the applied base 31 is subjected to patterning by photolithography. As a result, the thickness adjusting layer 41 for adjusting retardation is formed in at least a region corresponding to the display area.

(2) Process of Forming Common Electrode

Next, a process of forming a common electrode is performed. The process of forming a common electrode includes a process of forming the common electrode made of a transparent conductive material, such as ITO, and a process of forming the alignment film 45 for controlling the alignment of the liquid crystal material.

First, a transparent conductive layer made of a transparent conductive material, such as ITO, is formed over the thickness adjusting layer 41 by sputtering, and then the formed layer is subjected to patterning by photolithography, thereby forming the common electrode 33.

Then, by use of the same method as that for forming the alignment film 85 on the element substrate, the alignment film 45 is also formed on the opposite substrate. As in the case of the process of manufacturing the element substrate, the alignment film 45 is subjected to rubbing, thus becoming an alignment film that has a function of controlling the alignment of the liquid crystal material.

3. Panel Alignment Process

The panel alignment process is a process of depositing a sealant on either one of the opposite substrate and the element substrate so as to surround the display area, then overlaying the other one of the substrates thereon, bonding the opposite substrate and the element substrate together by thermocompression bonding, and forming a cell structure.

The liquid crystal material is injected into a gap between the pair of substrates formed as described above through an inlet formed in a part of the sealant. Then, the substrates are sealed with an end-sealing member. Thus, a liquid crystal panel filled with the liquid crystal material can be formed.

Post Process

The post process is a process of providing the outer surfaces of the opposite substrate and the element substrate with the retardation plates (quarter-wave plates) 47 and 87 and the polarizers 49 and 89, respectively, and mounting a driver IC. Through the processes, the liquid crystal apparatus 10 according to the embodiment of the invention, as shown in FIG. 2, can be manufactured.

Third Embodiment

An electronic device including the liquid crystal apparatus according to the first embodiment is described below as a third embodiment.

Figure 12:
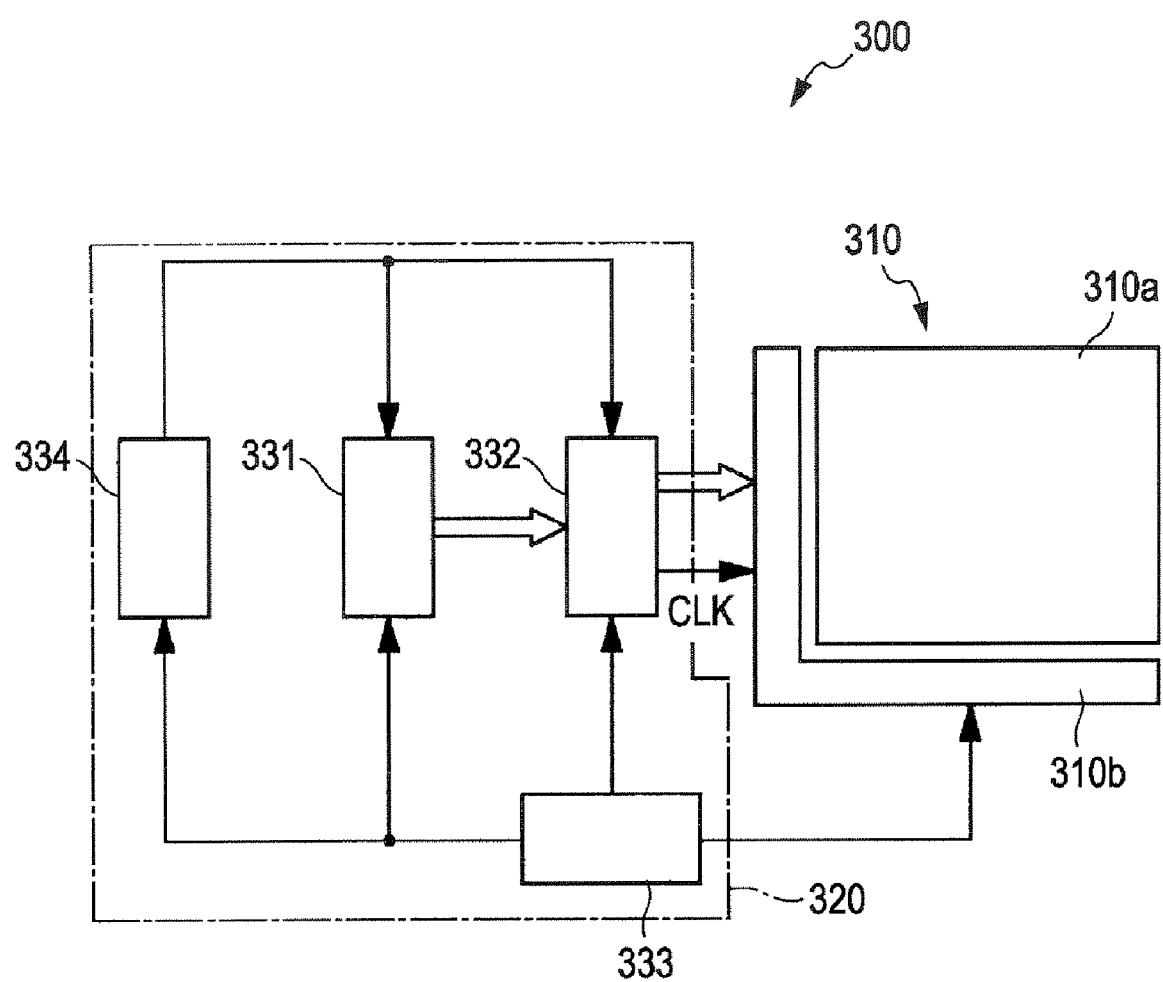
FIG. 12 is a block diagram showing an electronic device including an electro-optical apparatus according to the embodiment of the invention.

FIG. 12 is a block diagram of an electronic device 300 including an electro-optical apparatus according to one aspect of the invention. The electronic device 300 includes an electro-optical apparatus 310, such as a liquid crystal apparatus, and a controller 320 for controlling the electro-optical apparatus 310. In FIG. 12, the electro-optical apparatus 310 is shown as conceptually separated into a panel structure 310*a* and a driving circuit 310*b* composed of a semiconductor element. The controller 320 includes a display-information output source 331, a display-information processing circuit 332, a power supply circuit 333, and a timing generator 334.

The display-information output source 331 includes a memory, including a read-only memory (ROM) and a random-access memory (RAM), a storage unit, including a magnetic recording disk and/or an optical recording disk, and a tuning circuit for tuning and outputting a digital image signal. The display-information output source 331 supplies display information in the form of an image signal in a predetermined format to the display-information processing circuit 332 on the basis of various types of clock signals generated by the timing generator 334.

The display-information processing circuit 332 includes various types of known circuits, including a serial-to-parallel conversion circuit, an amplifying/inverting circuit, a rotation circuit, a gamma-correction circuit, and a clamping circuit. The display-information processing circuit 332 executes processing of input display information and supplies the image signal together with a clock signal CLK to the driving circuit 310*b*. The driving circuit 310*b* includes a first electrode-driving circuit, a second electrode-driving circuit, and a check circuit. The power supply circuit 333 has a function of supplying a predetermined voltage to each of the above-described components.

Therefore, since the electronic device according to the third embodiment includes an electro-optical apparatus that is excellent in the light scattering property and light directivity, the electronic device has reduced display unevenness and an excellent display quality.

Since the resin film includes a first region and a second region, the first and second regions having projections and/or depressions of different modes, at least one aspect of the invention provides an electro-optical apparatus that has visibility from each of a front direction and an oblique direction improved in a balanced manner and that is excellent in the light scattering property and the light directivity, a method for manufacturing the electro-optical apparatus, and an electronic device including the electro-optical apparatus.

As a result, an electro-optical apparatus, a method for manufacturing the electro-optical apparatus, and an electronic device including the electro-optical apparatus according to at least one aspect of the invention are applicable to a liquid crystal apparatus that includes a switching element, such as a TFT element or TFD element, and an electronic device including the liquid crystal apparatus, for example, a mobile phone, a personal computer, a liquid crystal television, a view-finder/monitor-direct-view videotape recorder, a car navigation system, a pager, an electrophoretic apparatus, an electronic organizer, a calculator, a word processor, a work station, a videophone, a POS terminal, an electronic device having a touch panel, and an apparatus including an electron emission element (e.g., field emission display (FED) or surface-conduction electron-emitter display (SCEED)).

What is claimed is:

1. An electro-optical apparatus comprising:
   a base;
   a resin film on the base, the resin film having at least one of projections and depressions at an upper surface thereof; and
   a light reflecting film disposed on the at least one of projections and depressions;
   wherein the resin film under the light reflecting film includes a first region and a second region, a mode of the at least one of projections and depressions in the first region being different from a mode of the at least one of projections and depressions in the second region, and
   wherein a diffuse reflectivity of the first region is larger than a diffuse reflectivity of the second region such that less light is reflected in a direction substantially perpendicular to the upper surface in the first region as compared to an amount of light reflected in a direction substantially perpendicular to the upper surface in the second region.

2. The electro-optical apparatus according to claim 1, wherein a density, $\rho 1$, of the at least one of projections and depressions in the first region is larger than a density, $\rho 2$, of the at least one of projections and depressions in the second region.

3. The electro-optical apparatus according to claim 2, wherein the density $\rho 1$ is in a range of 30% to 60% and the density $\rho 2$ is less than 30%.

4. The electro-optical apparatus according to claim 1, wherein $\phi 1$ is larger than $\phi 2$, where $\phi 1$ represents an equivalent-circle diameter of each of the at least one of projections and depressions in the first region viewed from a direction of the plane of the base and $\phi 2$ represents an equivalent-circle diameter of each of the at least one of projections and depressions in the second region viewed from the direction of the plane of the base.

5. The electro-optical apparatus according to claim 4, wherein the equivalent-circle diameter $\phi 1$ is in a range of 4 µm to 12 µm and the equivalent-circle diameter $\phi 2$ is less than 4 µm.

6. The electro-optical apparatus according to claim 1, wherein a height, h1, of each of the at least one of projections and depressions in the first region is larger than a height, h2, of each of the at least one of projections and depressions in the second region.

7. The electro-optical apparatus according to claim 6, wherein the height h1 is in a range of 0.4 µm to 4 µm and the height h2 is less than 0.4 µm.

8. The electro-optical apparatus according to claim 1, wherein a ratio of an area of the first region to an area of the second region is in a range of 10:90 to 90:10.

9. The electro-optical apparatus according to claim 1, wherein the base has a display area including a reflecting region and a transmitting region, and the at least one of projections and depressions in each of the first region and the second region are disposed in the reflecting region.

10. The electro-optical apparatus according to claim 1, wherein the base has a display area including a plurality of pixels, and at least one of the first region and the second region includes a plurality of subregions in each of the plurality of pixels.

11. The electro-optical apparatus according to claim 1, wherein the second region is a flat region having no projections and no depressions.

12. An electronic device comprising an electro-optical apparatus according to any one of claims 1 through 11.

* * * * *